United States Patent [19]

Stupp

[11] Patent Number: 4,712,124
[45] Date of Patent: Dec. 8, 1987

[54] COMPLEMENTARY LATERAL INSULATED GATE RECTIFIERS WITH MATCHED "ON" RESISTANCES

[75] Inventor: Edward H. Stupp, Spring Valley, N.Y.

[73] Assignee: North American Philips Corporation, New York, N.Y.

[21] Appl. No.: 945,420

[22] Filed: Dec. 22, 1986

[51] Int. Cl.$^4$ ............................................ H01L 29/78
[52] U.S. Cl. .................. 357/23.4; 357/23.14; 357/38; 357/39; 357/42; 357/43; 357/86
[58] Field of Search ................... 357/23, 4, 38, 39, 42, 357/86, 23, 14, 43

[56] References Cited

U.S. PATENT DOCUMENTS

| | | | |
|---|---|---|---|
| 4,609,929 | 9/1986 | Jayaraman et al. | 357/23.4 |
| 4,626,879 | 12/1986 | Colak | 357/23.14 |
| 4,631,565 | 12/1986 | Tihanyi | 357/42 |
| 4,639,761 | 1/1987 | Singer et al. | 357/43 |

Primary Examiner—Joseph E. Clawson, Jr.
Attorney, Agent, or Firm—Robert T. Mayer; Steven R. Biren

[57] ABSTRACT

A complementary Lateral Insulated Gate Rectifier (LIGR) includes two complementary LIGR structures fabricated in adjacent surface-adjoining semiconductor wells of the same conductivity type in a semiconductor substrate. The two LIGR structures are of generally similar configuration, thus simplifying the manufacturing process, and the proposed design additionally permits the n-channel and p-channel LIGR structures to have comparable "on" resistances. The two LIGR structures, otherwise isolated by a portion of the substrate separating the two semiconductor wells, are connected together by a common source electrode. The resulting complementary Lateral Insulated Gate Rectifier features a compact, integrated structure in which the "on" resistances of both the n-channel and p-channel portions of the device are comparable.

2 Claims, 2 Drawing Figures

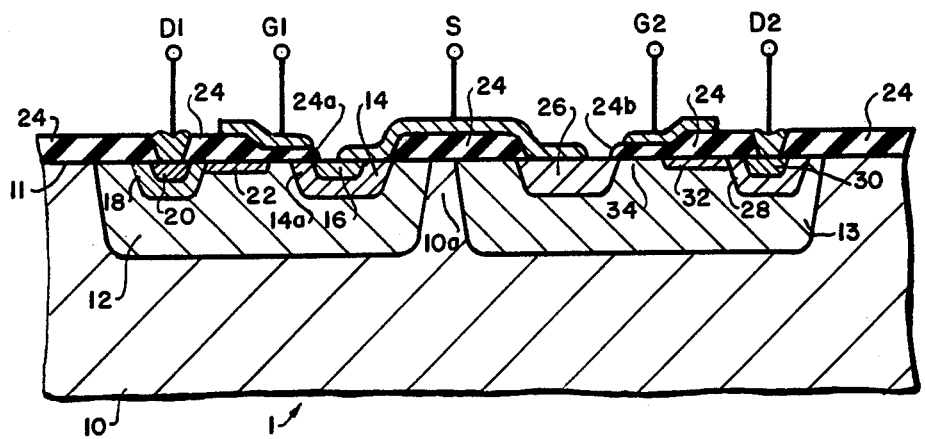
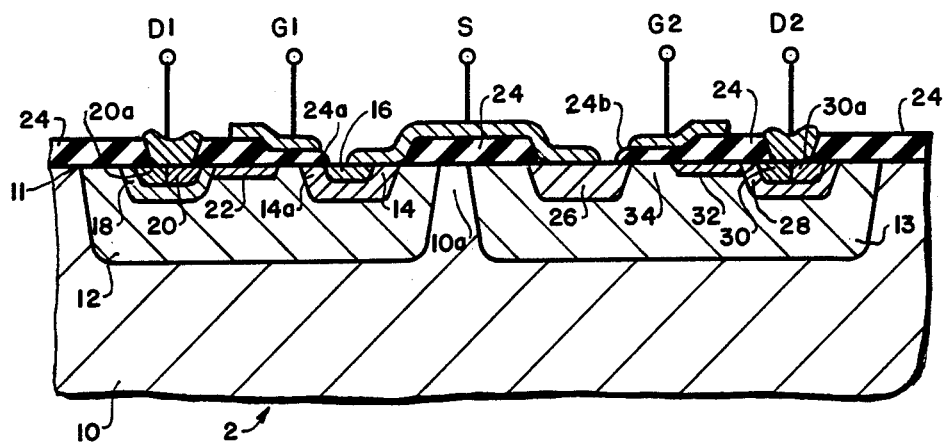
FIG.2

COMPLEMENTARY LATERAL INSULATED GATE RECTIFIERS WITH MATCHED "ON" RESISTANCES

BACKGROUND OF THE INVENTION

The invention is in the field of metal-oxide-semiconductor (MOS) devices, and relates specifically to complementary lateral insulated gate rectifiers for use in power circuit applications such as the electronic control of discharge lamps.

Known power control circuits frequently use a half-bridge configuration, with two identical switching transistors connected in series, with the source of one transistor connected to the drain of another to form a common output terminal. This type of configuration is typically used for integrated power circuits, because the required voltage rating of the transistors is lowest. Nevertheless, there are certain disadvantages to this configuration. For example, one transistor operates as a source follower, with an inherently higher "on" resistance than a common-source configuration and higher breakdown voltage to substrate when using standard constructions. While these disadvantages may be overcome, for example by using the source follower structure shown in U.S. patent application Ser. No. 766,665, now U.S. Pat. No. 4,626,879, the resulting structure will be more complex and difficult to fabricate.

Another solution, typically used for discrete component circuits, uses complementary MOS FET devices in a common-drain configuration. However, such a configuration is not practical in an integrated configuration, because of fabrication difficulties and because the two devices, if integrated, would have substantially different "on" resistances, thus resulting in an unbalanced output waveform.

SUMMARY OF THE INVENTION

It is therefore an object of the present invention to provide a complementary device suitable for use in power circuit applications, such as those requiring a half-bridge configuration, without the need for a source follower circuit.

Further objects of the invention are to provide a complementary device suitable for power circuit applications which can be easily and inexpensively integrated, while at the same time having two complementary switching devices with comparable "on" resistances.

In accordance with the invention, these objects are achieved by a unique complementary Lateral Insulated Gate Rectifier (LIGR) configuration. The LIGR is a relatively new type of device which has been found suitable for high-power switching applications. Several configurations for individual LIGR devices are shown, for example, in European patent application Ser. No. 83112186.8 (corresponding to U.S. Ser. No. 449,321). As can be seen in that reference, the configuration of an individual LIGR is quite similar to that of a lateral MOS transistor, and the problems associated with integrating two such devices into a complementary integrated circuit structure are similar to those described above.

These problems have been substantially overcome by a unique integrated complementary LIGR structure in accordance with the invention. In this structure, a semiconductor substrate of a first conductivity type is provided with first and second adjacent surface-adjoining semiconductor wells of a second, opposite conductivity type, with a portion of the substrate separating the two adjacent wells. A complementary LIGR structure is achieved by forming a complementary LIGR element in each well and interconnecting the two LIGR elements to form a complementary LIGR device. In accordance with the invention, in a manner to be described in further detail hereinafter, two complementary devices are provided in the two adjacent semiconductor wells of the same conductivity type, with the two devices being quite similar structurally and compatible from a fabrication point of view despite the fact that the two devices are complementary. In this manner, a simple, easily-fabricated, balanced, high performance complementary LIGR structure is obtained.

BRIEF DESCRIPTION OF THE DRAWING

FIG. 1 is a cross-sectional view of an LIGR in accordance with a first embodiment of the invention; and FIG. 2 is a cross-sectional view of an LIGR device in accordance with a second embodiment of the invention.

In the drawing, semiconductor zones and regions of like conductivity type are generally hatched in the same direction. Furthermore, it should be noted that the figures are not drawn to scale, and that, in particular, dimensions in the vertical direction have been exaggerated for improved clarity.

DESCRIPTION OF THE PREFERRED EMBODIMENTS

FIG. 1 of the drawing shows a complementary Lateral Insulated Gate Rectifier (LIGR) device suitable for use in power circuit applications such as the electronic control of discharge lamps. In FIG. 1, an LIGR device 1 has a semiconductor substrate 10 of a first conductivity type, hereinafter p-type, with a doping concentration level of about $5 \times 10^{14}$ atoms/cm$^3$. On a major surface 11 of the substrate there are located two adjacent surface-adjoining semiconductor wells 12 and 13 of a second conductivity type opposite to the first, hereinafter n-type, and having a doping concentration level of about $1 \times 10^{15}$ atoms/cm$^3$. The thickness of these semiconductor wells is typically in the range of about 5–20 microns. It should be noted that all of the doping levels and region thicknesses specified herein are merely illustrative, and that particular parameters for a given device will be selected in accordance with conventional design and fabrication techniques depending upon such factors as operating voltage, power level and the like. Although the two semiconductor wells are adjacent each other, they are not in direct contact, but rather are separated from each other by a narrow portion 10a of the semiconductor substrate 10.

A first portion of the complementary LIGR device is located in first well 12, and includes a first surface-adjoining semiconductor region 14 of the first conductivity type in first well 12 and a shallower, surface-adjoining first source region 16 of the second conductivity type in the first semiconductor region 14. Here, first semiconductor region 14 is of p-type conductivity, with a doping concentration level of about $10^{16}$–$10^{17}$ atoms/cm$^3$ and a thickness of about 3–4 microns, while first source region 16 is of n-type conductivity, with a doping concentration level of about $10^{18}$ atoms/cm$^3$ and a thickness of less than or equal to about 1 micron.

The portion of the LIGR structure in the first well is completed by a drain structure including a first surface-adjoining drain region 18 of the second conductivity type in first well 12, a second, shallower surface-adjoining drain region 20 of the first conductivity type in the first region 18, and a first surface-adjoining drain extension region 22 of the first conductivity type in first well 12 and extending from the first drain region 18 toward the first semiconductor region 14. Region 18 is of n-type conductivity, with a thickness of about 3-4 microns and a doping concentration level equal to or greater than about $10^{17}$ atoms/cm$^3$, while region 20 is of p-type conductivity, with a doping concentration level of about $10^{18}$ atoms/cm$^3$ and a thickness of less than or equal to about 1 micron. Region 22 is of p-type conductivity, with a doping level of about $2 \times 10^{16}$ atoms/cm$^3$ and a thickness of about 1 micron.

An oxide insulating layer 24 on the major surface 11 has a first insulating layer portion 24a located over the first well 12 and covering at least a portion 14a of first semiconductor region 14 located between first source region 16 and first drain region 18.

The first portion of the LIGR structure is completed by a drain electrode $D_1$ connected to the second drain region 20, a gate electrode $G_1$ on insulating layer portion 24a and over portion 14a of region 14, and a source electrode S connected to first semiconductor region 14, first source region 16 and also to a second surface-adjoining source region 26 of the first conductivity type located in the second well 13. The second source region 26 is of p-type conductivity, with a doping concentration level of about $10^{\neq}$-$10^{17}$ atoms/cm$^3$ and a thickness of about 3-4 microns.

The remainder of the device structure within second semiconductor well 13 is for the most part a mirror image of the previously-described structure in first well 12, with a third surface-adjoining drain region 28 of the first conductivity type in the second well and a fourth, shallower surface-adjoining drain region 30 of the second conductivity type in the third drain region 28. A second surface-adjoining drain extension region 32 of the first conductivity type is provided in the second well, and extends from third drain region 28 toward second source region 26. The thickness and doping concentration of region 32 are the same as for previously-described region 22, while region 28 is of p-type conductivity and has a doping concentration level of about $10^{16}$-$10^{17}$ atoms/cm$^3$ and a thickness of about 3-4 microns. Region 30 is of n-type conductivity, with a thickness of less than or equal to about 1 micron and a doping level of about $10^~$ atoms/cm$^3$.

The device structure is completed by a second insulating layer portion 24b of insulating layer 24 on major surface 11, over second well 13 and covering at least that portion of the second well between the second source region 26 and the second drain extension region 32. A second gate electrode $G_2$ is provided on the second insulating layer portion 24b over at least the portion 34 of the second well between the second source region and the second drain extension region. Finally, a second drain electrode $D_2$ provides a connection to fourth drain region 30.

It should be noted that while the two halves of the complementary LIGR device are generally symmetrical (with the exception of the source region configurations), nevertheless the desired complementary mode of operation is achieved by having the symmetrically-located gate electrodes forming channel regions in different portions of the device. Thus, in first well 12, an appropriate signal applied to gate electrode $G_1$ will create a channel region in portion 14a of the first semiconductor region 14, while in the second semiconductor well 13, gate electrode $G_2$ will form an analogous channel region in portion 34 of second well 13 between the second source region 26 and the second drain extension region 32. In this manner, a complementary device configuration is achieved with a generally symmetrical device structure, with the associated advantage of manufacturing simplicity.

An LIGR device in accordance with a second embodiment of the invention is shown in FIG. 2. In FIG. 2, complementary LIGR device 2 has substantially the same structural configuration as previously-described device 1, with the exception of the structure of second and fourth surface-adjoining drain regions 20 and 30, respectively. Accordingly, like reference numerals are used to identify like regions of the two devices, and in the interest of brevity, these regions are not further described.

The device of FIG. 2 differs from the device of FIG. 1 in the configuration of the drain regions. In device 2, a fifth surface-adjoining drain region 20a of the second conductivity type (here n-type) is provided in the first drain region 18, alongside second drain region 20 and connected to first drain electrode $D_1$. Similarly, a sixth surface-adjoining drain region 30a of the first conductivity type (here p-type) is provided in the third drain region 28, alongside fourth drain region 30 and connected to the second drain electrode $D_2$. The doping concentration and thickness of drain regions 20a and 30a are comparable to those of drain regions 30 and 20, respectively.

The extra complexity of the drain configuration in the embodiment shown in FIG. 2 is justified by the fact that this device offers improved performance. In the device shown in FIG. 1, drain regions 18,20 and 28,30 are of opposite conductivity types, thus forming p-n junctions in the conduction path. The associated forward voltage drop of about 0.7 volts results in additional power dissipation, which can become significant at high current levels. This additional power dissipation is substantially avoided in the device of FIG. 2, since initial conduction is through the resistive path including regions 18,20a and 28,30a. Since each pair of regions is of the same conductivity type (regions 18 and 20a are of n-type, while 28 and 30a are of p-type) the additional power dissipation due to the voltage drop of the forward-biased junction in the device of FIG. 1 is avoided by the resistive path across the junction. Additional information concerning a similar type of dual-drain structure is contained in U.S. patent application Ser. No. 802,781.

In summary, the present invention provides a complementary LIGR switching device which can be easily and inexpensively integrated, and which is capable of providing two complementary switching devices having comparable "on" resistances. Furthermore, these advantages are achieved without the need for a source-follower circuit.

While the invention has been particularly shown and described with reference to several preferred embodiments thereof, it will be understood by those skilled in the art that various changes in form and detail may be made without departing from the spirit or scope of the invention.

I claim:

1. A complementary Lateral Insulated Gate Rectifier (LIGR), which comprises:

a semiconductor substrate of a first conductivity type and having a major surface;

first and second adjacent surface-adjoining semiconductor wells of a second conductivity type opposite to that of said first type in said substrate and separated from each other by a portion of said substrate;

a first surface-adjoining semiconductor region of the first conductivity type in said first well and a shallower, surface-adjoining first source region of the second conductivity type in said first semiconductor region;

a first surface-adjoining drain region of the second conductivity type in said first well and a second, shallower surface-adjoining drain region of the first conductivity type in said first drain region;

a first surface-adjoining drain extension region of the first conductivity type in said first well and extending from said first drain region toward said first semiconductor region;

an insulating layer on said major surface and having a first insulating layer portion over said first well and covering at least a portion of said first semiconductor region between said first source region and said first drain region;

a first gate electrode on said first insulating layer portion, over at least said portion of the first semiconductor region, and insulated from said substrate;

a second surface-adjoining source region of the first conductivity type in said second wall;

a third surface-adjoining drain region of the first conductivity type in said second well and a fourth, shallower surface-adjoining drain region of the second conductivity type in said third drain region;

a second surface-adjoining drain extension region of the first conductivity type in said second well and extending from said third drain region toward said second source region;

a second insulating layer portion of said insulating layer on said major surface over said second well and covering at least a portion of said second well between said second source region and said second drain extension region;

a second gate electrode on said second insulating layer portion, over at least said portion of said second well, and insulated from said substrate;

first and second drain electrodes connected, respectively, to said second and fourth drain regions; and a source electrode connected to said first semiconductor region, said first source region and said second source region.

2. A complementary Lateral Insulated Gate Rectifier (LIGR) as in claim 1, further comprising a fifth surface-adjoining drain region of the second conductivity type in said first drain region, contacting said second drain region, and connected to said first drain electrode, and a sixth surface-adjoining drain region of the first conductivity type in said third drain region, contacting said fourth drain region, and connected to said second drain electrode.

* * * * *